US010411701B2

(12) United States Patent
Nelson et al.

(10) Patent No.: US 10,411,701 B2
(45) Date of Patent: Sep. 10, 2019

(54) TRIAXIAL PHOTOCONDUCTIVE SWITCH MODULE (71) Applicant: Lawrence Livermore National Security, LLC, Livermore, CA (US)

(72) Inventors: Scott D. Nelson, Patterson, CA (US); Steve Hawkins, Livermore, CA (US); Brian R. Poole, Tracy, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 16/167,316

(22) Filed: Oct. 22, 2018

(65) Prior Publication Data

US 2019/0052264 A1  Feb. 14, 2019

Related U.S. Application Data (62) Division of application No. 15/069,838, filed on Mar. 14, 2016, now Pat. No. 10,110,224.

(51) Int. Cl.
| | |
|---|---|
| *H03K 17/78* | (2006.01) |
| *H01L 31/09* | (2006.01) |
| *G02B 6/00* | (2006.01) |
| *G02B 6/12* | (2006.01) |
| *G02B 6/24* | (2006.01) |
| *H01L 49/02* | (2006.01) |

(52) U.S. Cl.
CPC ............. *H03K 17/78* (2013.01); *G02B 6/00* (2013.01); *G02B 6/12004* (2013.01); *G02B 6/24* (2013.01); *H01L 28/00* (2013.01); *H01L 31/09* (2013.01)

(58) Field of Classification Search
CPC ................................ H03K 17/78; H03K 3/57
See application file for complete search history.

(56) References Cited

U.S. PATENT DOCUMENTS

| | | | |
|---|---|---|---|
| 3,308,308 A | 3/1967 | Bray | |
| 4,376,920 A | 3/1983 | Smith | |
| 5,512,790 A * | 4/1996 | Lachenmaier | .......... H01L 24/06 307/112 |

(Continued)

FOREIGN PATENT DOCUMENTS

| | | |
|---|---|---|
| EP | 1552536 A2 | 6/2010 |
| WO | 2012162702 B1 | 11/2012 |

OTHER PUBLICATIONS

Belser, R.B., "Electrical Resistances of Thin Metal Films before and after Artificial Aging by Heating," Journal of Applied Physics, 28(1):109-116, Jan. 1957.

(Continued)

*Primary Examiner* — Thanh Luu
(74) *Attorney, Agent, or Firm* — Perkins Coie LLP (57) ABSTRACT

Methods, systems, and devices describe triaxial photoconductive switch modules that include a center conductor, an inner conductor, an outer conductor, a high voltage capacitor that is formed between the center conductor and the inner conductor, and a photoconductive switch that is formed between the center conductor and a section of the outer conductor. The disclosed triaxial photoconductive switch modules include low inductance current paths that lead to high current efficiencies. Furthermore, the disclosed triaxial photoconductive switch modules eliminate or reduce parasitic capacitance problems of existing systems.

8 Claims, 7 Drawing Sheets

(56) References Cited

U.S. PATENT DOCUMENTS

| | | |
|---|---|---|
| 6,943,319 B2 | 9/2005 | Jones |
| 7,897,490 B2 | 3/2011 | Preble et al. |
| 8,125,089 B2 | 2/2012 | Caporaso et al. |
| 8,258,632 B1 | 9/2012 | Sullivan et al. |
| 8,299,554 B2 | 10/2012 | Adkisson et al. |
| 8,655,125 B2 | 2/2014 | Sullivan |
| 10,110,224 B2 | 10/2018 | Nelson et al. |
| 2005/0173149 A1 | 8/2005 | Gouge et al. |
| 2013/0328058 A1 | 12/2013 | Nelson |
| 2013/0328146 A1 | 12/2013 | Nelson |
| 2013/0342306 A1 | 12/2013 | Sampayan |
| 2014/0363123 A1 | 12/2014 | Caporaso |
| 2017/0264291 A1 | 9/2017 | Nelson et al. |
| 2018/0013028 A1 | 1/2018 | Nelson et al. |

OTHER PUBLICATIONS

Sali, S., et al., "Triaxial cable designs with optimum braided shields," IEE Proceedings A (Physical Science, Measurement and Instrumentation, Management and Education), 137(4):165-174, Jul. 1990.

Sullivan, J.S., "Wide Bandgap Extrinsic Photoconductive Switches," ProQuest Dissertations and Theses, Ph.D. Thesis University of California, Davis, 2013, vol. 75-03(E), Sec. B, 375 pages, Jul. 2013.

\* cited by examiner

Supply a voltage across a photoconductive switch of a triaxial photoconductive switch module, where the triaxial photoconductive switch module further comprises: an outer conductor, an inner conductor, a central conductor, and a high voltage capacitor positioned between the center conductor and at least a section of the inner conductor
702

Apply light from a light source to the photoconductive switch to activate the photoconductive switch and to thereby cause a current to flow through the inner conductor, across the high voltage capacitor, through the center conductor, through the photoconductive switch and to the outer conductor
704

FIG. 7

TRIAXIAL PHOTOCONDUCTIVE SWITCH MODULE

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This patent document relates to systems, devices, and processes that use photoconductive switch technologies.

BACKGROUND

A photoconductive switch is an electrical switch that is controlled by an optical input (e.g., light) to cause photo-induced conductivity of the switch material. For example, light applied to the switch material can increase its electrical conductance as a consequence of irradiation with light. Photoconductive switches can be used for photoconductive sampling, generation of high frequency pulses (e.g., terahertz pulses), high-speed photodetectors in optical fiber communications, and in analog-to-digital converters, among other applications. Existing photoconductive switch modules can be designed using various package geometries. However, the energy storage systems in the switch module that feed such photoconductive switches include considerable parasitic capacitive and inductive effects due to the geometry of the structure containing the energy storage.

SUMMARY

The disclosed techniques, systems, and devices relate to triaxial photoconductive switch modules that include low inductance current paths that lead to high current efficiencies, overcome parasitic capacitance problems of existing systems, and enable efficient and simple heat dissipation and thermal management.

One aspects of the disclosed technology relates to a triaxial photoconductive switch module that includes an outer conductor, an inner conductor, a center conductor and a dielectric material positioned between the center conductor and at least a section of the inner conductor to form a high voltage capacitor. The triaxial photoconductive switch module also includes a photoconductive switch formed between the center conductor and a section of the outer conductor such that upon activation of the photoconductive switch, an electrical connection is formed between the center conductor and the outer conductor that enables a current to flow through the inner conductor, across the high voltage capacitor, through the center conductor, through the photoconductive switch and to the outer conductor.

In one exemplary embodiment, the triaxial photoconductive switch module further includes a light source coupled to the photoconductive switch to enable activation of the photoconductive switch. In some implementation, the outer electrode includes an opening to allow light from the light source to be coupled to photoconductive material of the photoconductive switch. In one exemplary embodiment, the opening can enable free space propagation of the light through the opening and onto the photoconductive material. In another exemplary embodiment, the light source includes an optical fiber that couples light from the light source to the photoconductive material through the opening. For example, the optical fiber can include an asymmetric concave end that is positioned inside the opening to allow the light from the optical fiber to enter the photoconductive switch at a non-normal angle of incidence.

In another exemplary embodiment, each of the outer conductor, the inner conductor and the high voltage capacitor forms an axially symmetric structure about an axis that runs through a center of the central electrode. In one exemplary embodiment, the cylindrically symmetric structure of the high voltage capacitor is characterized by a base radius and a height, where the height of the symmetric structure of the high voltage capacitor is smaller than a height of the cylindrically symmetric structure formed by the inner conductor. In yet another exemplary embodiment, the section of the outer conductor forming a portion of the photoconductive switch is configured as a cold plate to allow dissipation of heat generated by resistive loss in the photoconductive switch.

According to another exemplary embodiment, the photoconductive switch further includes one or more surfaces having a high reflectance coating to allow confinement of light within a photoconductive material of the photoconductive switch. In still another exemplary embodiment, the section of the outer conductor forming a portion of the photoconductive switch includes a reflective surface to allow confinement of light within a photoconductive material of the photoconductive switch. In one exemplary embodiment, the high voltage capacitor is formed as a cast-in-place capacitor.

Another aspect of the disclosed technology relates to a method for forming a triaxial photoconductive switch module that includes selecting one or more of a height value or a base radius value for a high voltage capacitor structure having a particular dielectric material. The above noted method further includes forming a triaxial structure that includes: a cylindrically symmetric outer conductor, a cylindrically symmetric inner conductor, and a center conductor having a height equal to the selected height value of the high voltage capacitor structure. The method additionally includes forming the high voltage capacitor structure by placing the particular dielectric material within a volume formed by the center conductor and the inner conductor, and forming a photoconductive switch between one end of the center conductor and a section of the outer conductor.

In one exemplary embodiment, forming the high voltage capacitor includes pouring or injecting the particular dielectric material in liquid form into the volume formed by the center conductor and the inner conductor, and allowing the liquid to settle into a solid form. One or more characteristics of the high voltage capacitor can be changed by changing one or both a volume or the particular dielectric material that form the high voltage capacitance structure. In another exemplary embodiment, the above noted method further includes forming an opening within a section of the outer conductor that forms at least a portion of the photoconductive switch to allow coupling of a light source to the photoconductive switch. In one exemplary embodiment, the above noted method also includes positioning an optical fiber within the opening to allow delivery of light from the light source to a photoconductive material of the photoconductive switch.

According to another exemplary embodiment, the above noted method further includes providing a high reflectance coating to one or more surfaces of the photoconductive switch to facilitate confinement of light within the photoconductive switch. In yet another exemplary embodiment, at least a portion of the outer electrode is formed to operate a cold plate for dissipating heat produced by the photoconductive switch.

Another aspect of the disclosed embodiments relates to a method for operating a triaxial photoconductive switch that includes supplying a voltage across a photoconductive switch of the triaxial photoconductive switch module. The triaxial photoconductive switch module further comprises an outer conductor, an inner conductor, a center conductor, and a high voltage capacitor positioned between the center conductor and at least a section of the inner conductor. The above noted method for operating the triaxial photoconductive switch also includes applying light from a light source to the photoconductive switch to activate the photoconductive switch and to thereby cause a current to flow through the inner conductor, across the high voltage capacitor, through the center conductor, through the photoconductive switch and to the outer conductor.

DETAILED DESCRIPTION

In this patent document, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

High voltage and high current switches have broad applicability, e.g., in the charged particle accelerator community. The ability to modulate high voltage and high current can be an enabling technique for pulsed systems, e.g., such as radar systems, communication systems, arbitrary-waveform generated high power RF sources, amplifier systems and many other applications. As noted earlier, the existing photoconductive switch modules are plagued by parasitic effects that degrade the generated pulse waveforms and decrease the amplitude of the output waveforms.

Disclosed are devices, systems, and methods that relate to triaxial photoconductive switch module that include energy storage capacitors that eliminate or reduce such parasitics, and provide low inductance current paths and an efficient optical feedback system. In some embodiments, the energy storage capacitor is constructed as a cast-in-place capacitor. As will be described in further detail below, the disclosed triaxial photoconductive switch module can also include a cold-plate formed as part of an outer conductor that facilitates thermal management.

In some implementation, the triaxial system described herein benefits from low inductance of a cast-in-place capacitor inside of the body of the resulting coaxial output structure. As will be described in further detail, the output impedance of such triaxial photoconductive switch module is easily settable by adjusting the inner and outer coaxial dimensions. In particular, the energy storage capacitor of the module is separately settable by changing the length of the cast-in-place capacitor and the center conductor and inner conductor dimensions.

Figure 1:
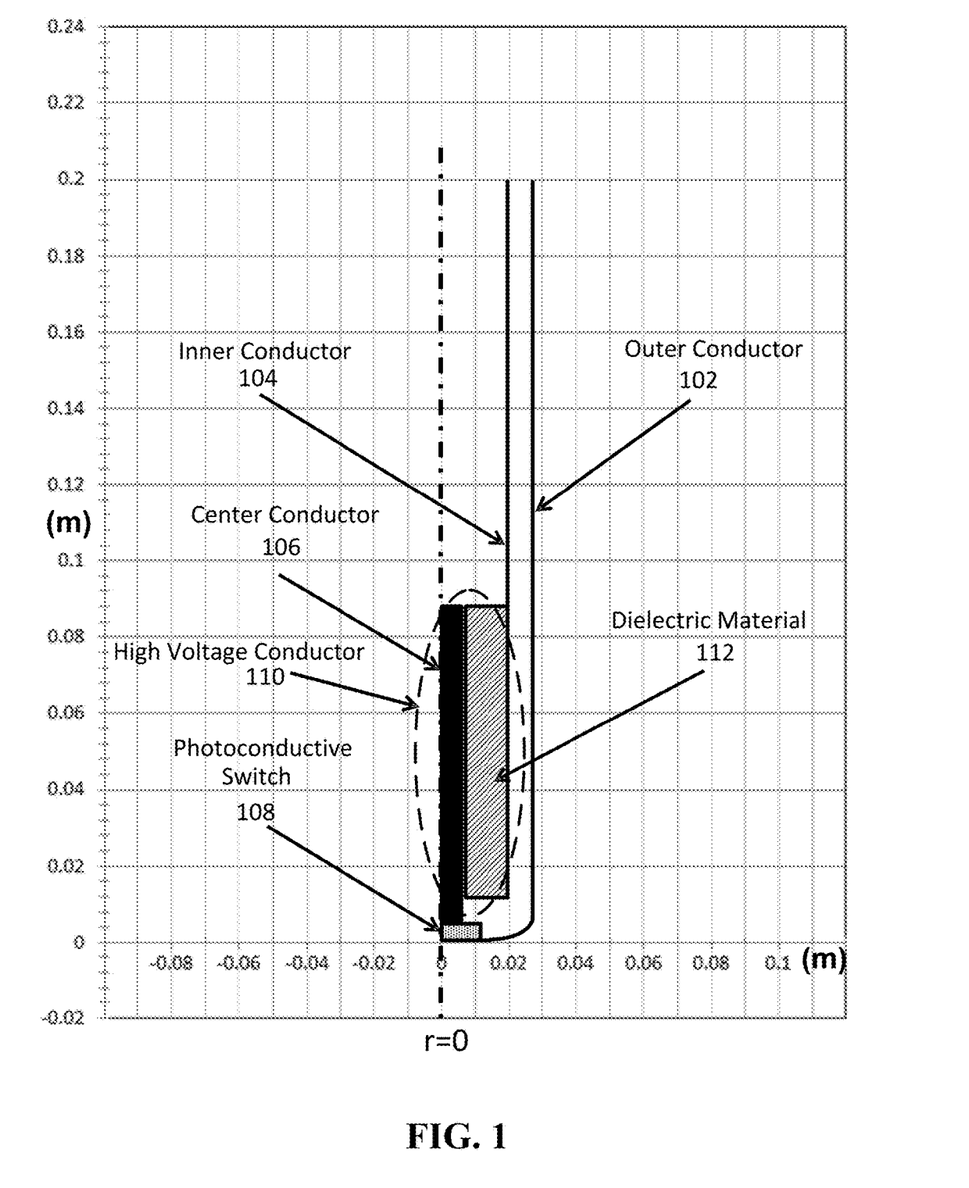
FIG. 1 illustrates a axially symmetric cross-sectional side view of a triaxial photoconductive switch module in accordance with an exemplary embodiment.

FIG. 1 illustrates an axially symmetry cross-sectional side view of a triaxial photoconductive switch module in accordance with an exemplary embodiment. The exemplary triaxial photoconductive switch module (sometimes referred to as the "module") includes an outer conductor 102, an inner conductor 104 and a center conductor 106. A solid-state photoconductive switch 108 is arranged at one end of the module between an end portion of the center conductor 106 and the outer conductor 102. A high voltage capacitor 110 (identified using the dashed oval) is produced by placing a dielectric material 112 between the center conductor 106 and the inner electrode 104. The high voltage capacitor 110 in FIG. 1 forms a cast-in-place capacitor. Incident light (not shown) on the photoconductive switch 108 activates (turns on) the photoconductive switch 108, resulting in a current flow through the module.

It should be noted that the diagram of FIG. 1 only shows part of the module. It is, however, understood that the disclosed module forms a concentric structure that is symmetric with respect to the axis r that passes through the center of the center electrode. Moreover, for the sake of illustration and not by limitation, FIG. 1 illustrates a cylindrical module having a base radius of approximately 2 cm and a height of approximately 20 cm. The cast-in-place capacitor 110 has a base radius of approximately 1 cm and a height of approximately 10 cm. The dimensions of the triaxial module (including the cast-in-place capacitor 110) can be modified to provide the desired characteristics. In particular, characteristics of the high voltage capacitor can be altered by changing the dimensions (e.g., base radius and/or height) of the cast-in-place capacitor 110, as well as by changing the dielectric material 112.

In some implementations, the cast-in-place capacitor 110 is formed by injecting or pouring the dielectric material 112 in a liquid form (e.g., an epoxy) between the center conductor 106 and the inner conductor 104, and subsequently allowing the liquid to settle into a solid form. In this way, uniformity of the dielectric material 112 can be improved. In other implementations, the cast-in-place capacitor 110 can be formed using nano-materials or bulk ceramic dielectric material. In an alternate embodiment, the high voltage storage capacitor can be implemented using an array of discrete capacitors.

High voltage energy storage is provided by the high voltage capacitor 110, which allows for a low inductance current path. The photoconductive switch 108 controls the flow of current between the center conductor 106 and the inner conductor 104 and the outer conductor 102. In operation, the charging phase occurs between the center conductor 106 and the inner conductor 104 when the high voltage charging system charges the high voltage capacitor 110. The voltage can be supplied by, for example, high voltage charging cables, such as a coaxial cable, that attaches between the center conductor 106 and the inner conductor 104. Upon activation of the photoconductive switch 108, the coaxial output is formed by the inner conductor 104 and the outer conductor 102 (which see voltage and current flow and form the output coaxial transmission line). The volume between the outer conductor 102 and the inner conductor can comprise an air gap, vacuum, or filled with appropriate insulating material. The current path starts at the coaxial output, flows down the inner conductor 104, across the energy storage high voltage capacitor 110, down the center conductor 106, through the photoconductive switch 108, and then flows up and out of the outer conductor 102.

Figure 2A:
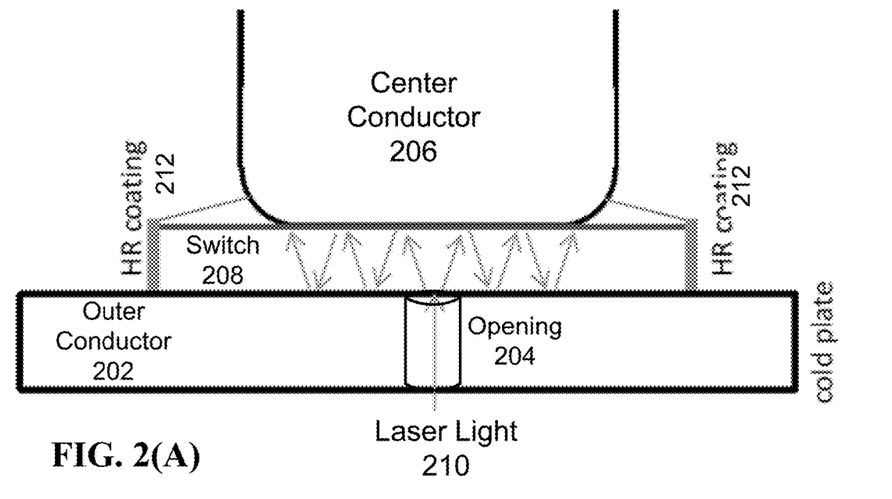
FIG. 2(A) illustrates a simplified diagram of a photoconductive switch that is suited for use in a single-sided axial-fed photoconductive switch packet according to an exemplary embodiment.

FIG. 2(A) illustrates a magnified and simplified diagram of a photoconductive switch that is suited for use in a single-sided axial-fed photoconductive switch module according to an exemplary embodiment. In FIG. 2(A), an exemplary laser light 210 is coupled to the photoconductive switch 208 through an opening 204 in the outer conductor 202. In general, light that illuminates the photoconductive switch 208 can produced from a coherent light source, such as a laser, or from an incoherent light source, such as an LED with suitable spectral characteristics. The laser light 210 is produced by an appropriate source and can be shaped (e.g., collimated) using optical components for free space propagation through the opening 204. Upon entry into the photoconductive material of the photoconductive switch 208, the incident light undergoes multiple reflections from top and bottom high reflective surfaces of the photoconductive switch 208 (e.g., high reflective surfaces of the center electrode 206 and outer electrode 202). In some implementations, a high reflectance (HR) coating 212 is applied to the ends (or other surfaces) of the photoconductive switch 208 to confine the light within the photoconductive switch 208.

Figure 2B:
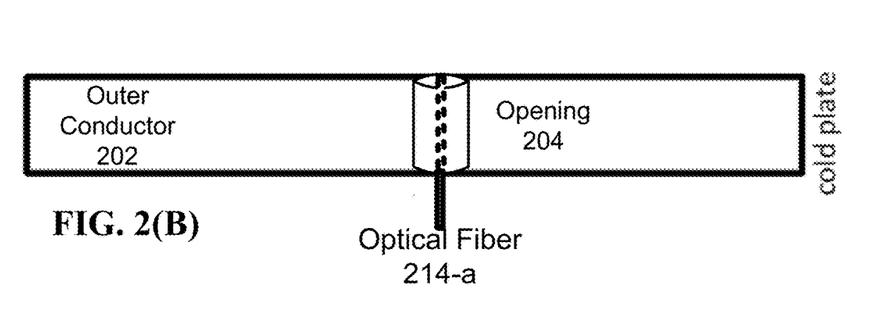
FIG. 2(B) illustrates an alternate embodiment of FIG. 2(A) in which an optical fiber is used to provide light to the photoconductive switch at a normal angle of incidence.
Figure 2C:
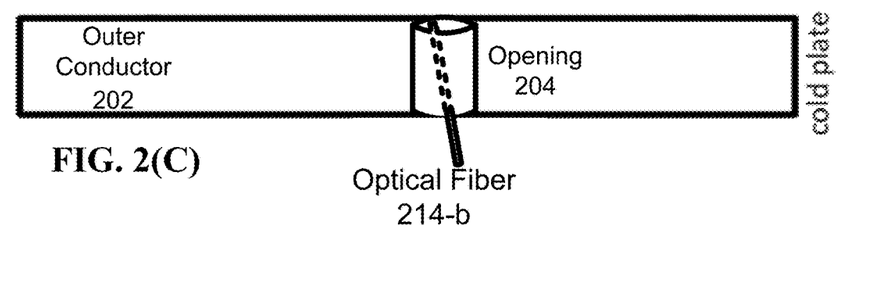
FIG. 2(C) illustrates an alternate embodiment of FIG. 2(A) in which an optical fiber is used to provide light to the photoconductive switch at a non-normal angle of incidence.

FIG. 2(B) illustrates an alternative configuration of the photoconductive switch of FIG. 2(A) in which an optical fiber 214-a is used to deliver the light at a normal angle of incidence to the photoconductive switch 208 through the opening 204. FIG. 2(C) illustrates another alternative configuration of the photoconductive switch of FIG. 2(A) in which an optical fiber 214-b is used to deliver the light at an oblique angle (or off-normal) to the photoconductive switch 208 through the opening 204. In some implementations, the end of the fiber 214-b is cleaved. For example, an asymmetric concave cut fiber is inserted at an angle into the opening, and the end of the fiber is cleaved to be flush with the upper surface of the outer conductor 202. While a wide divergence of light within the photoconductive material can be effectuated using either the normal or oblique angles of incidence, having an oblique angle facilitates divergence and propagation of light through the photoconductive material, and reduces (or eliminates) backflow of the reflected light into the light source.

It should be noted that FIGS. 2(A) to 2(C) only represent diagrammatic illustrations of the components and thus may not represent accurate scale or relative dimensions of the depicted components. In addition, in FIGS. 2(B) and 2(C), the components that are positioned above the outer conductor 202 are omitted to simplify the illustrations.

The disclosed photoconductive switch modules further facilitate heat management and mitigation. To dissipate the heat generated due to the photoconductive switch's finite on-resistance, at least part of the outer conductor forms a cold plate (see, e.g., the cold plates labeled in FIGS. 2(A) to 2(C)). The photoconductive switch is in intimate contact with the cold-plate, which provides a mechanism to remove heat from the switch.

Figure 3:
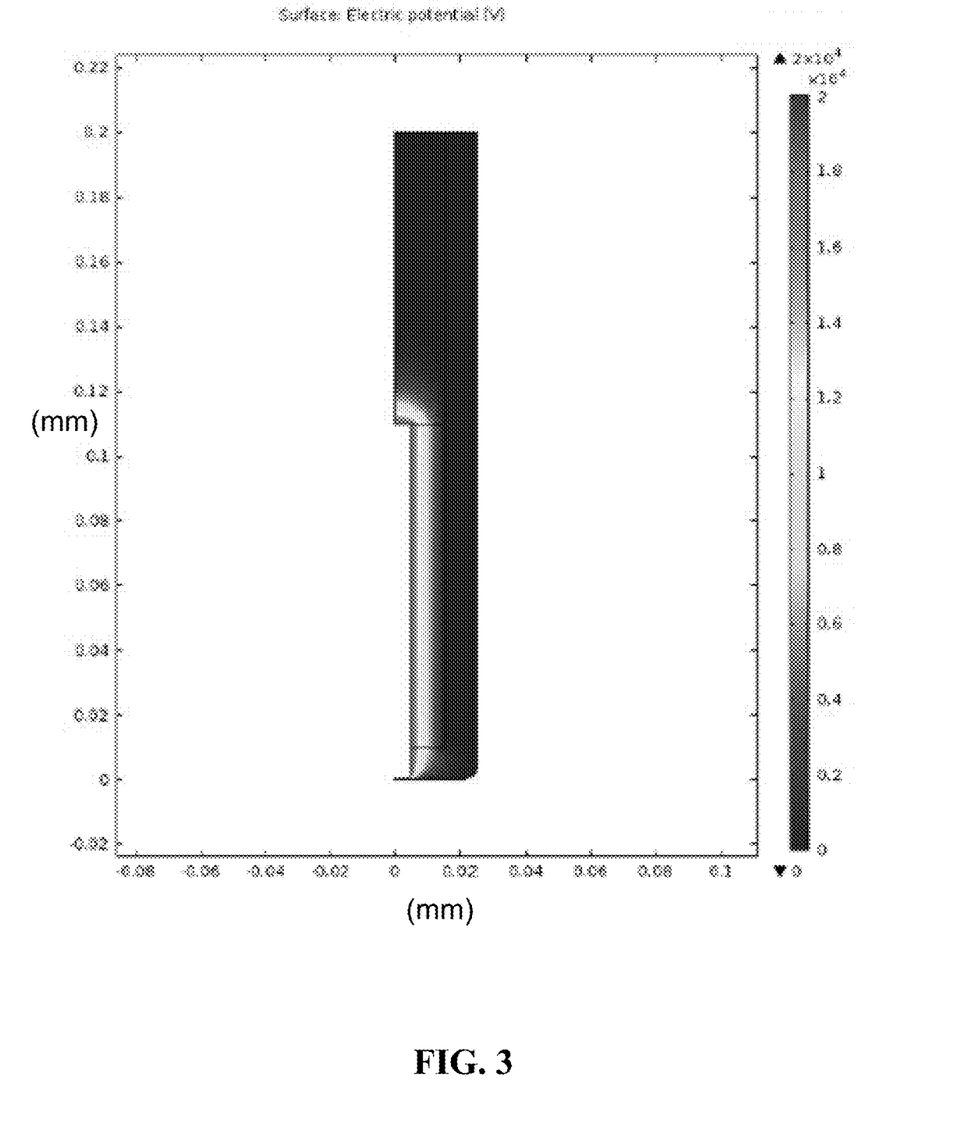
FIG. 3 illustrates an exemplary plot of surface electric potential across various sections of the triaxial photoconductive switch module in its charged state of FIG. 1.
Figure 4:
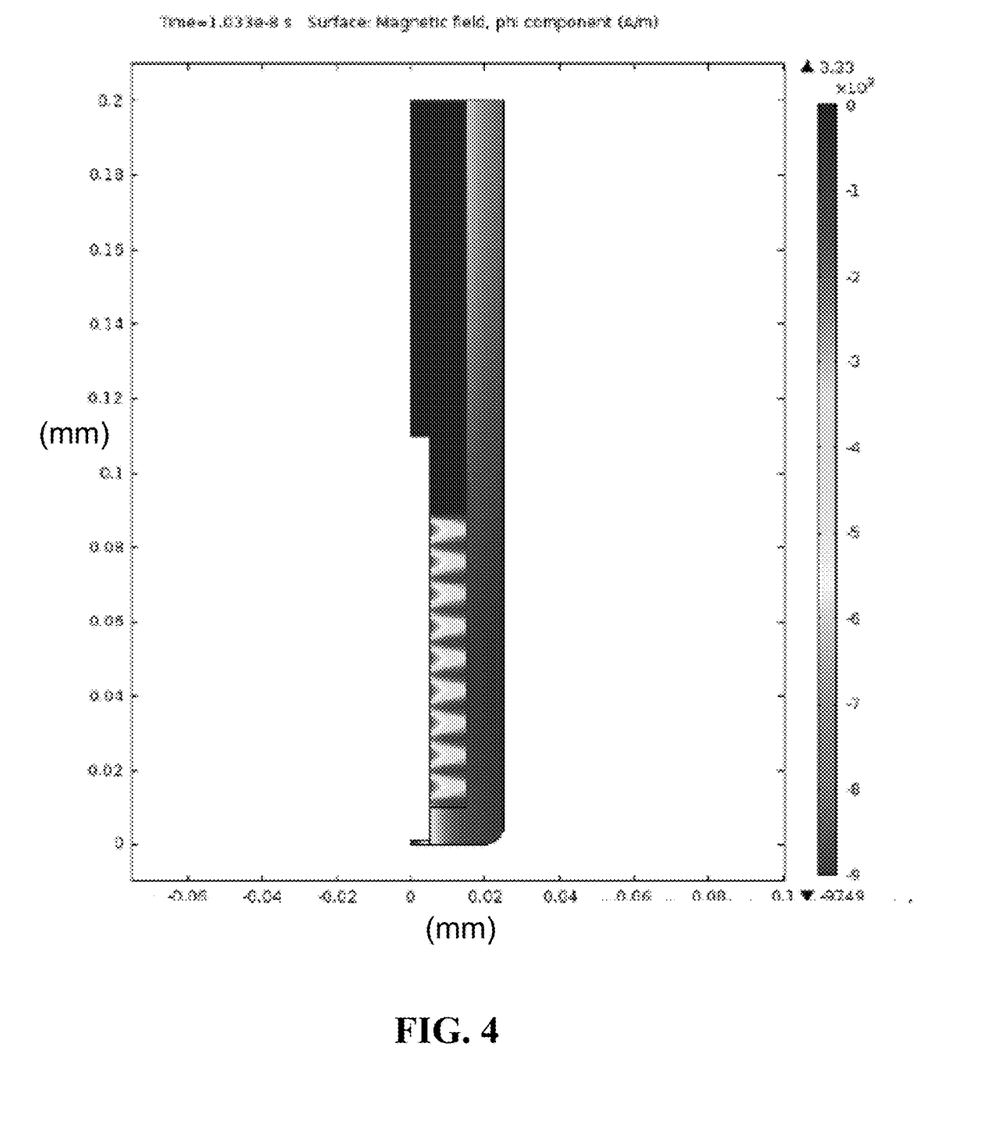
FIG. 4 illustrates an exemplary plot of magnetic field across various sections of the triaxial photoconductive switch module at a snapshot in time of FIG. 1.
Figure 5A:
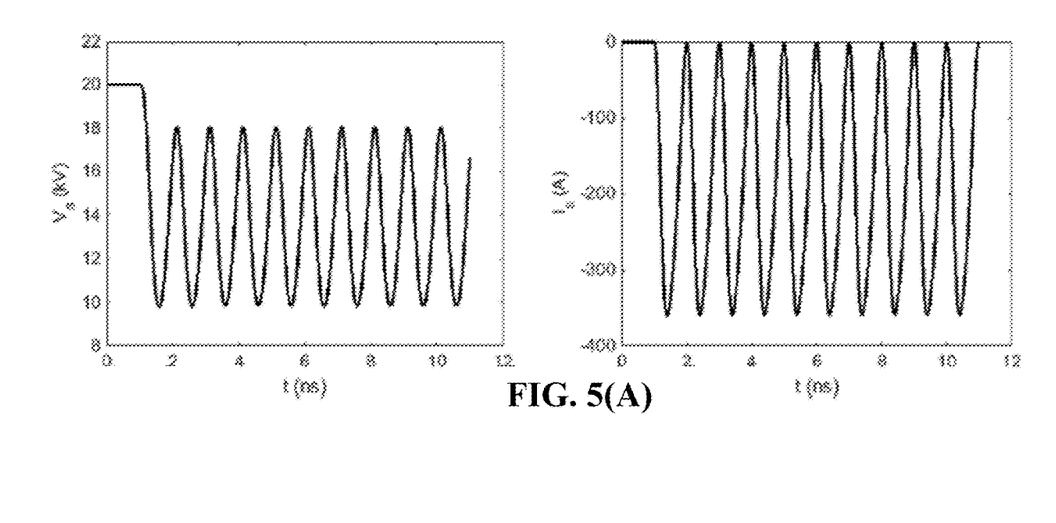
FIG. 5(A) illustrates exemplary voltage and current plots (versus time) across an exemplary photoconductive switch.
Figure 5B:
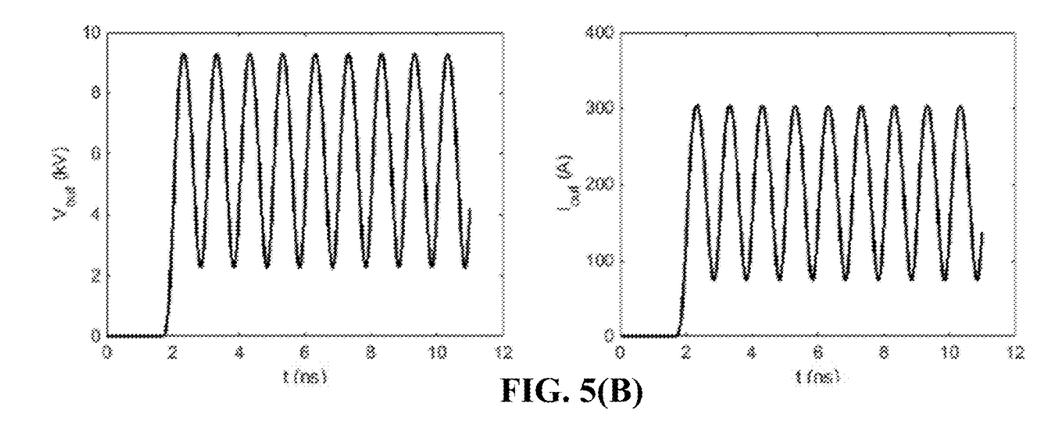
FIG. 5(B) illustrates output voltage and output current plots (versus time) corresponding to the triaxial photoconductive switch module having switch voltage and current value of FIG. 5(A).

FIG. 3 illustrates a plot of surface electric potential across various sections of the triaxial photoconductive switch module of FIG. 1. FIG. 3 shows high electrostatic potentials across the capacitor that is produced by a pulsed current source that charges the electrodes and the energy storage capacitor. FIG. 4 illustrates a plot of magnetic field across various sections of the triaxial photoconductive switch module of FIG. 1. The surface plot in FIG. 4 is a snapshot in time that shows a pulse train being produced by a pulsed laser that controls the photoconductive switch. In this case, the output pulse is in the right-hand coaxial line (formed between the inner conductor and the outer conductor). The pulse train visible in the magnetic field plot (between the center conductor and the inner conductor) is the compressed pulse as it penetrates through the capacitor. The output pulse is shown in FIGS. 5(B). Note that on this time scale and amplitude scale, the output pulse shown in FIG. 4 has a peak of 3000 A/m given a charge voltage of 21 kV. The output pulse is spatially broad compared to the compressed pulses in the dielectric material.

In the disclosed triaxial photoconductive switch modules, the current through the photoconductive switch appears as conduction current out of the coaxial output. Such modules are highly current efficient and include low inductance current paths. This high current efficiency can be illustrated by the exemplary plots of FIGS. 5(A) and 5(B) that are produced using the exemplary triaxial photoconductive switch module of FIG. 1. FIG. 5(A) illustrates voltage, $V_s$, and current, $I_s$, plots (versus time) of the photoconductive switch. FIG. 5(B) illustrates the corresponding output voltage, $V_{OUT}$, and output current, $I_{OUT}$, plots (versus time) of the triaxial photoconductive switch module. Comparison of the output and switch current plots demonstrates that an overall current efficiency of about 83% can be achieved (i.e., 300/360=0.83). The plots in FIGS. 5(A) and 5(B) further illustrate that a 21 kV charge voltage can produce a 385 kW peak RF output (i.e., 110 A×3.5 kV=385 kW).

As demonstrated above, the disclosed triaxial photoconductive switch modules include a high capacitance which is separately charged through one pair of conductors and discharged through the pair of output conductors in a coaxial arrangement. Current coupled across the gap (e.g., an air gap) between the inner conductor and the outer conductor is manifest as a loss mechanism and the capacitance of this gap is separately controllable.

Figure 6:
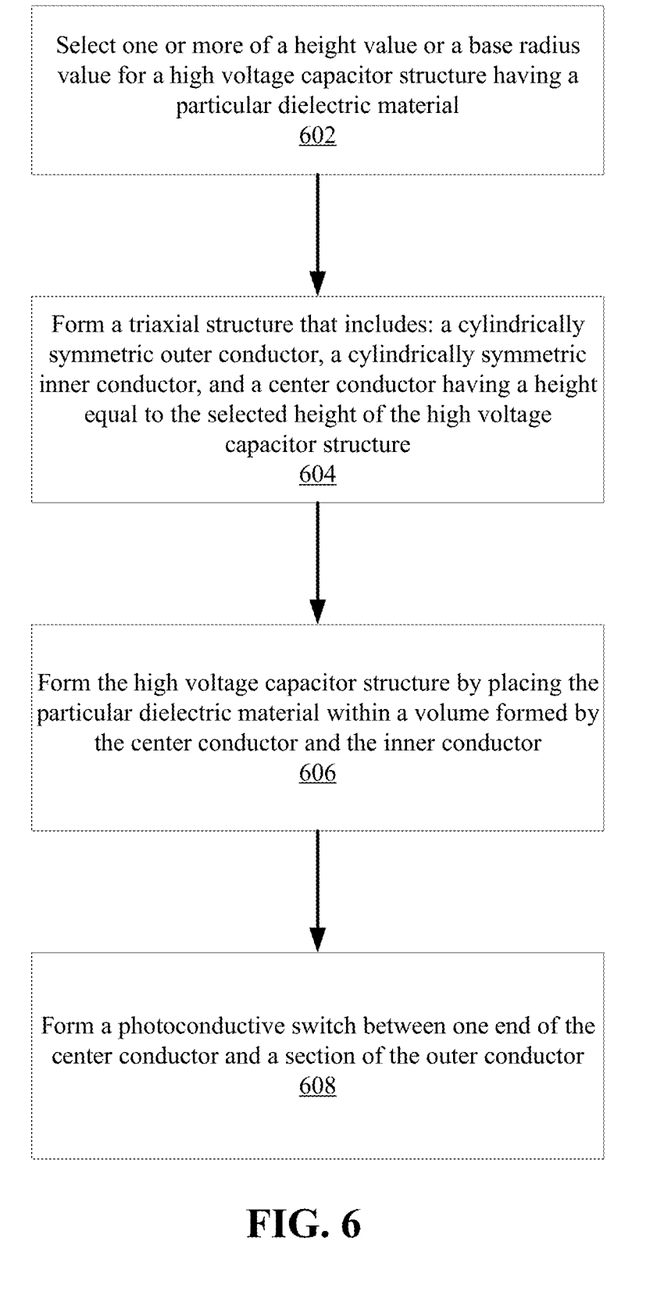
FIG. 6 illustrate a set of exemplary operations that can be carried out as part of forming a triaxial photoconductive switch module in accordance with an exemplary embodiment.

FIG. 6 illustrates a set of exemplary operations that can be carried out as part of forming a triaxial photoconductive switch module in accordance with an exemplary embodiment. In particular, at 602, one or more of a height value or a base radius value for a high voltage capacitor structure having a particular dielectric material is selected. At 602, a triaxial structure is formed that includes: a cylindrically symmetric outer conductor, a cylindrically symmetric inner conductor, and a center conductor having a height equal to the selected height of the high voltage capacitor structure. At

606, the high voltage capacitor structure is formed by placing the particular dielectric material within a volume formed by the center conductor and the inner conductor. At 608, a photoconductive switch between one end of the center conductor and a section of the outer conductor is formed.

Figure 7:
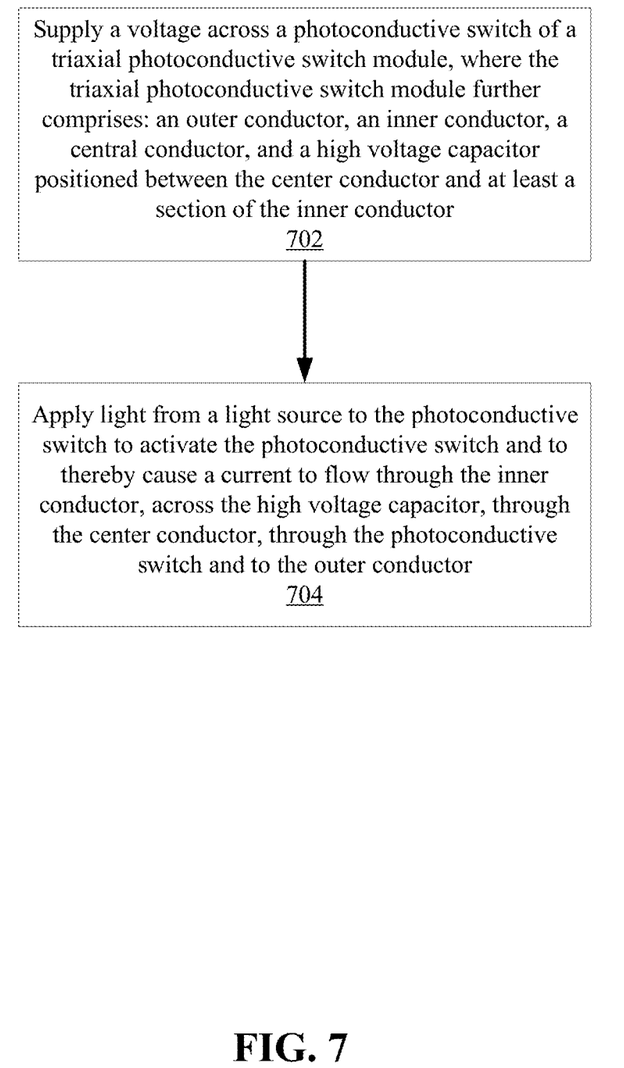
FIG. 7 illustrate a set of exemplary operations that can be carried out as part of operating a triaxial photoconductive switch in accordance with an exemplary embodiment.

FIG. 7 illustrates a set of exemplary operations that can be carried out as part of operating a triaxial photoconductive switch in accordance with an exemplary embodiment. At 702, a voltage across a photoconductive switch of the triaxial photoconductive switch is supplied. The triaxial photoconductive switch module further includes: an outer conductor, an inner conductor, a center conductor, and a high voltage capacitor positioned between the center conductor and at least a section of the inner conductor. At 704, light from a light source is applied to the photoconductive switch to activate the photoconductive switch and to thereby cause a current to flow through the inner conductor, across the high voltage capacitor, through the center conductor, through the photoconductive switch and to the outer conductor.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for forming a triaxial photoconductive switch module, comprising:
   selecting one or more of a height value or a base radius value for a high voltage capacitor structure having a particular dielectric material;
   forming a triaxial structure that includes:
   a cylindrically symmetric outer conductor,
   a cylindrically symmetric inner conductor, and
   a center conductor having a height equal to the selected height of the high voltage capacitor structure,
   forming the high voltage capacitor structure by placing the particular dielectric material within a volume formed by the center conductor and the inner conductor; and
   forming a photoconductive switch between one end of the center conductor and a section of the outer conductor.

2. The method of claim 1, wherein forming the high voltage capacitor includes pouring or injecting the particular dielectric material in liquid form into the volume formed by the center conductor and the inner conductor, and allowing the liquid to settle into a solid form.

3. The method of claim 1, wherein one or more characteristics of the high voltage capacitor are changeable by changing one or both a volume or the particular dielectric material that form the high voltage capacitance structure.

4. The method of claim 1, further comprising forming an opening within a section of the outer conductor that forms at least a portion of the photoconductive switch to allow coupling of a light source to the photoconductive switch.

5. The method of claim 4, further comprising positioning an optical fiber within the opening to allow delivery of light from the light source to a photoconductive material of the photoconductive switch.

6. The method of claim 4, further comprising providing a high reflectance coating to one or more surfaces of the photoconductive switch to facilitate confinement of light within the photoconductive switch.

7. The method of claim 1, wherein at least a portion of the outer electrode is formed to operate as a cold plate for dissipating heat produced by the photoconductive switch.

8. A method for operating a triaxial photoconductive switch module, comprising:
   supplying a voltage across a photoconductive switch of the triaxial photoconductive switch module, wherein the triaxial photoconductive switch module further comprises:
   an outer conductor,
   an inner conductor,
   a center conductor, and
   a high voltage capacitor positioned between the center conductor and at least a section of the inner conductor; and
   applying light from a light source to the photoconductive switch to activate the photoconductive switch and to thereby cause a current to flow through the inner conductor, across the high voltage capacitor, through the center conductor, through the photoconductive switch and to the outer conductor.

* * * * *